US012672561B2

(12) United States Patent (10) Patent No.: US 12,672,561 B2

Meliane et al. (45) Date of Patent: Jun. 30, 2026

(54) DIE ATTACH SYSTEM

(71) Applicant: Qorvo US, Inc., Greensboro, NC (US)

(72) Inventors: Walid Meliane, Plano, TX (US);
Christo Bojkov, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 276 days.

(21) Appl. No.: 17/657,185

(22) Filed: Mar. 30, 2022

(65) Prior Publication Data

US 2023/0178467 A1 Jun. 8, 2023

Related U.S. Application Data

(60) Provisional application No. 63/285,239, filed on Dec. 2, 2021.

(51) Int. Cl.
| | |
|---|---|
| *H10W 70/65* | (2026.01) |
| *H10W 72/00* | (2026.01) |
| *H10W 72/20* | (2026.01) |
| *H10W 72/30* | (2026.01) |
| *H10W 72/90* | (2026.01) |
| *H10W 74/15* | (2026.01) |
| *H10W 90/00* | (2026.01) |

(52) U.S. Cl.
CPC .......... *H10W 70/65* (2026.01); *H10W 72/072* (2026.01); *H10W 72/252* (2026.01); *H10W 72/352* (2026.01); *H10W 72/952* (2026.01); *H10W 74/15* (2026.01); *H10W 90/724* (2026.01); *H10W 90/734* (2026.01)

(58) Field of Classification Search
CPC ......... H01L 24/05; H01L 24/13; H01L 24/16; H01L 24/73; H01L 24/81; H01L 2224/16225; H01L 2224/32225
See application file for complete search history.

(56) References Cited

U.S. PATENT DOCUMENTS

| | | |
|---|---|---|
| 7,187,077 B1 | 3/2007 | Nagarajan |
| 9,899,292 B2 | 2/2018 | Chiu et al. |
| 2005/0077614 A1 | 4/2005 | Chengalva et al. |

(Continued)

OTHER PUBLICATIONS

Galloway, J. et al., "Thermal performance of FCMBGA: Exposed molded die compared to lidded package," 2011 27th Annual IEEE Semiconductor Thermal Measurement and Management Symposium, Mar. 20-24, 2011, San Jose, CA, USA, IEEE, 6 pages.

(Continued)

*Primary Examiner* — Jay C Kim
*Assistant Examiner* — Woo K Lee
(74) *Attorney, Agent, or Firm* — Withrow & Terranova, P.L.L.C.

(57) ABSTRACT

A die attach system includes a substrate that has scored grooves or into which stud bumps on a die are then inserted. The additional surface area and flow of the stud bumps into the trenches creates a strong mechanical bond that may withstand repeated thermal cycling. In a further exemplary aspect, the substrate may be covered in a first material, the stud bumps may be made from the same first material, a die attachment material may be made from the same first material, and a bottom layer of the die may be made from the same material. This material homogeneity allows for more uniform expansion and contraction during thermal cycling, preventing failure of the mechanical bond.

11 Claims, 5 Drawing Sheets

(56) References Cited

U.S. PATENT DOCUMENTS

| | | | |
|---|---|---|---|
| 2007/0045812 A1* | 3/2007 | Heng | H01L 24/13 |
| | | | 257/E21.511 |
| 2007/0108634 A1 | 5/2007 | Higashi et al. | |
| 2009/0283900 A1* | 11/2009 | Yamada | H01L 21/566 |
| | | | 257/E23.181 |
| 2015/0146399 A1* | 5/2015 | Viswanathan | B23K 20/023 |
| | | | 228/180.1 |
| 2017/0263515 A1 | 9/2017 | Bolognia et al. | |
| 2019/0311963 A1 | 10/2019 | Christianson et al. | |
| 2020/0304920 A1 | 9/2020 | Achehboune et al. | |
| 2021/0050650 A1 | 2/2021 | Chiu et al. | |
| 2022/0324231 A1 | 10/2022 | Koike et al. | |
| 2023/0063692 A1 | 3/2023 | Wang et al. | |
| 2023/0209789 A1 | 6/2023 | Saito et al. | |

OTHER PUBLICATIONS

Islam, N. et al., "Backside Metallization for Low Cost High Thermal Package," 2006 56th IEEE Electronic Components and Technology Conference (ECTC 2006), retrieved Jul. 12, 2022 from https://www.semiconductorpackagingnews.com/uploads/1/Backside_metalization_for_high_thermal_and_low_cost_package_IMAPS_DPC2020_extended_abstract.pdf, 4 pages.

Sure, G. et al., "Evaluation and Characterization of Molded flip-chip BGA Package for 28nm FPGA Applications," IPC APEX EXPO Conference Proceedings, Feb. 2012, retrieved Jul. 12, 2022 from http://www.circuitinsight.com/pdf/evaluation_characterization_molded_flip_chip_ipc.pdf, 9 pages.

* cited by examiner

100

114

108

110

112

102

106

104

100

102

106

104

116

DIE ATTACH SYSTEM

RELATED APPLICATIONS

This application claims the benefit of provisional patent application Ser. No. 63/285,239, filed Dec. 2, 2021, the disclosure of which is hereby incorporated herein by reference in its entirety.

FIELD OF THE DISCLOSURE

The present disclosure relates to techniques to attach a die to a substrate such as a semiconductor die to a copper tab.

BACKGROUND

Computing devices rely on large numbers of transistors and supporting circuits that are contained within semiconductor dies. These dies are typically mounted on a substrate or metallization layer through some attachment means. In many instances, the substrate and the die are made from different materials with different thermal coefficients and different rates of thermal expansion. When large numbers of transistors are operating within such a die, there may be occasions where the amount of waste heat generated may cause the expansion and contraction of the die at a rate different than the expansion and contraction of the substrate. Such differing rates puts mechanical strain or stress on the attachment means. Repeated thermal cycling may lead to mechanical failure of the attachment means. Accordingly, there is room for improvement in the ways with which dies are attached to substrates.

SUMMARY

Aspects disclosed in the detailed description include a die attach system. In a particular aspect, the die attach system scores or otherwise creates trenches in a substrate into which stud bumps on a die are then inserted. The additional surface area and flow of the stud bumps into the trenches creates a strong mechanical bond that may withstand repeated thermal cycling. In a further exemplary aspect, the substrate may be covered in a first material, the stud bumps may be made from the same first material, a die attachment material, a die attachment material is made from the same first material, and a bottom layer of the die may be made from the same material. This material homogeneity allows for more uniform expansion and contraction during thermal cycling, preventing failure of the mechanical bond.

In this regard in one aspect, an assembly is disclosed. The assembly comprises a die. The die comprises one or more transistors therein. The die also comprises a bottom surface. The assembly also comprises a substrate comprising a top surface. The top surface comprises a plurality of grooves thereon. The assembly also comprises a plurality of stud bumps extending from the bottom surface to at least one of the plurality of grooves.

In another aspect, an assembly is disclosed. The assembly comprises a die. The die comprises one or more transistors therein. The die also comprises a bottom surface. The assembly also comprises a substrate comprising a top surface. The assembly also comprises a plurality of stud bumps extending from the bottom surface to the top surface. The bottom surface, the top surface, and the plurality of stud bumps comprise a first substantially homogeneous material.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
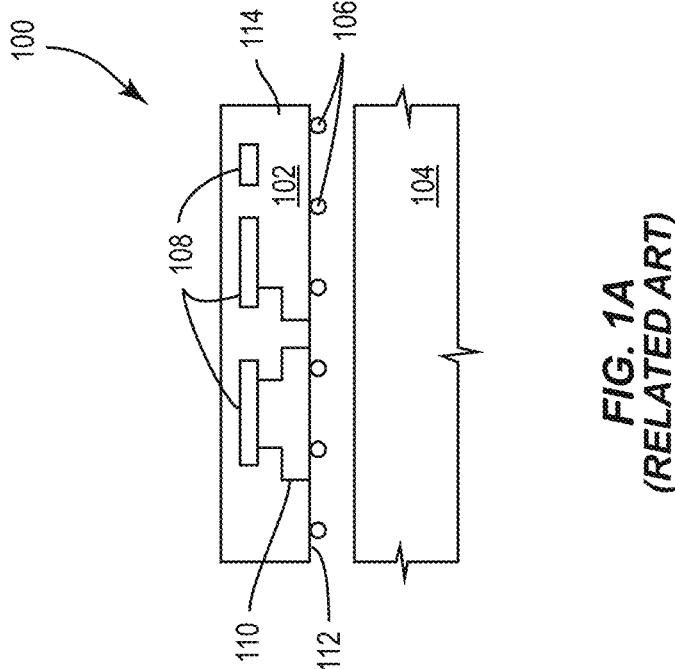
FIG. 1A is a cross-sectional view of a conventional die attachment technique to a conventional substrate.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Aspects disclosed in the detailed description include a die attach system. In a particular aspect, the die attach system scores or otherwise creates trenches in a substrate into which stud bumps on a die are then inserted. The additional surface area and flow of the stud bumps into the trenches creates a strong mechanical bond that may withstand repeated thermal cycling. In a further exemplary aspect, the substrate may be covered in a first material, the stud bumps may be made from the same first material, a die attachment material may be made from the same first material, and a bottom layer of the die may be made from the same material. This material homogeneity allows for more uniform expansion and contraction during thermal cycling, preventing failure of the mechanical bond.

Figure 1B:
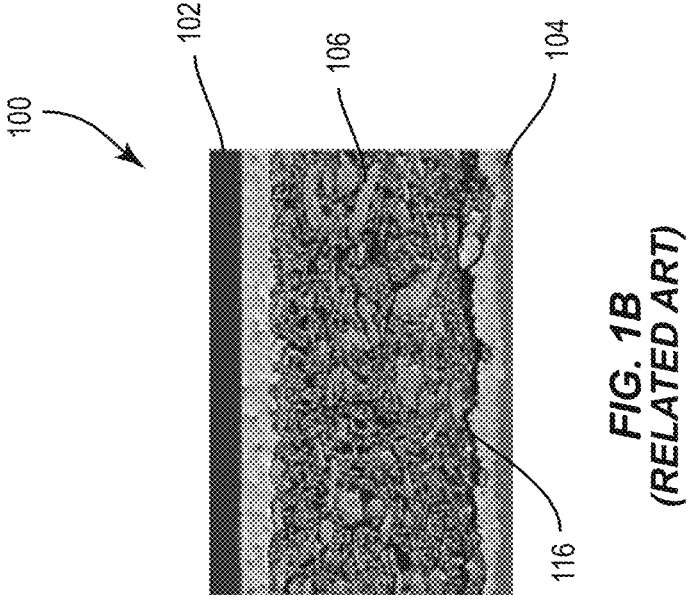
FIG. 1B is an electron microscope view of the attachment means of the conventional die attachment technique of FIG. 1A after repeated thermal cycling.

Before addressing exemplary aspects of the present disclosure, a brief overview of a conventional die attachment technique and its shortcomings is illustrated in FIGS. 1A and 1B. A discussion of exemplary aspects of the present disclosure begins below with reference to FIG. 2.

In this regard, FIG. 1A illustrates a side elevation view of an assembly 100 having a semiconductor die 102 secured to a substrate 104 through die or stud bumps 106. Typically, the die 102 may include multiple transistors 108 such as those made from gallium nitride (GaN) or gallium arsenide (GaAs) semiconductor materials that are positioned on an internal substrate such as a bulk silicon, silicon carbide (SiC), silicon on insulator, silicon on sapphire, or similar material (not shown specifically). The die 102 may include vias 110 or other metallization layers (not shown) within the die 102 as is well known. Additionally, the die 102 may be encased in some overmold material with exposed conductors for electrical connections to the transistors 108 within the die 102. The overmold material may have a bottom surface 112, which may be coated with a conductive material such as gold (Au).

The substrate 104 may be a copper/nickel (Cu/Ni) material or the like. The stud bumps 106 may be silver (Ag) or other conductive material. Typically, the materials of the bottom surface 112, the stud bumps 106, and the substrate 104 are heterogeneous. For example, Au, Ag, and Cu/Ni. These materials may have different thermal coefficients and expand and contract with heat differently. The differences in expansion and contraction create sheer forces which are greater proximate edges 114 of the die 102 than they are at the center of the die 102. These sheer forces are prone to cause cracks 116 in the adhesion between the die 102 and the substrate 106 as shown in FIG. 1B.

Exemplary aspects of the present disclosure provide a variety of ways to improve the mechanical bond and interlock mechanism between a die and a substrate. In a first aspect, the substrate is scored or grooved on a top surface. Stud bumps on the die are pressed into the grooves, creating a mechanical interlock between the materials. The grooves provide additional surface area through which attachment can be made, improving the mechanical bond. In a further exemplary aspect, the materials of the die bottom, the stud bump, and the substrate are substantially homogeneous so that thermal changes cause similar expansion and contraction of the materials, resulting in less stress on the bond and less likelihood of causing cracks even when subjected to repeated thermal cycling. Note that the substantially homogeneous materials may also be used without the grooves and still provide better coupling than some existing coupling techniques.

Figure 2:
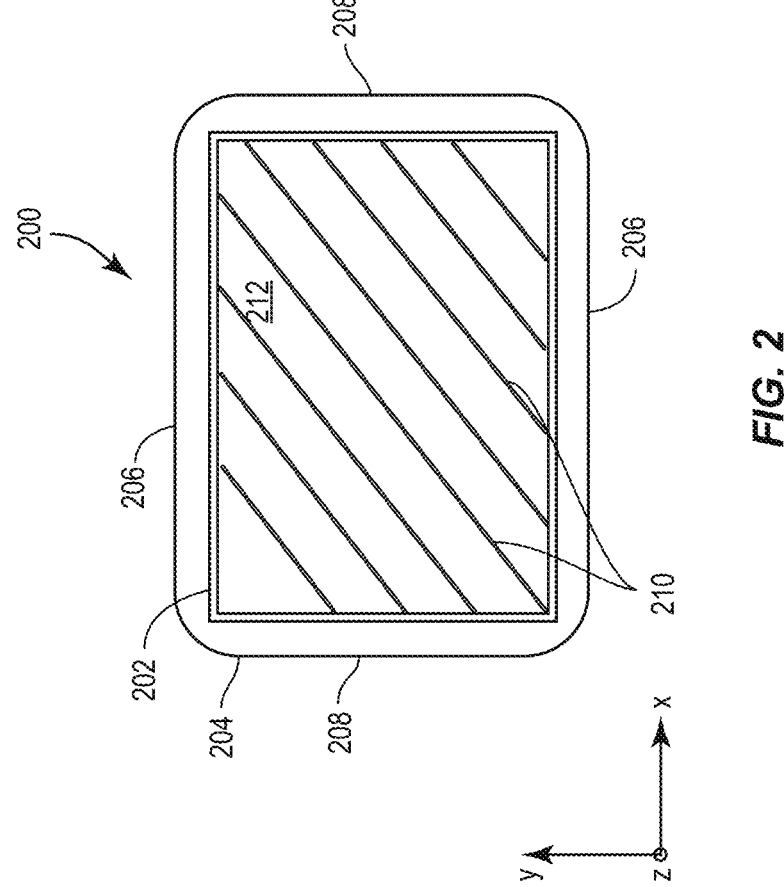
FIG. 2 is a top plan view of a substrate with trenches created on a top surface to assist in creating a mechanical bond with a die according to exemplary aspects of the present disclosure.

In this regard, FIG. 2 illustrates a base or substrate 200, which may be a copper, nickel, or copper/nickel material on which a trench 202 is created. The trench 202 may be spaced interiorly of and extend around an entire perimeter 204 of the substrate 202. The perimeter 204 may include a first set of parallel edges 206 that are parallel to an x-axis and a second set of parallel edges 208 that are parallel to a y-axis. In an exemplary aspect, the trench 202 may be made using a laser etching process. Alternatively, some form of mechanical scoring or pressure cut may create the trench 202. The trench 202 is optional but has uses when there is a die-attach material used with the stud bumps as explained in greater detail below. Further, the substrate 200 may include grooves 210. The grooves 210 may be made through laser etching or some mechanical scoring. In a first aspect, the grooves 210 are made at an angle to the x and y axes. In a second aspect, the grooves 210 are parallel to one of the x-axis or the y-axis (neither shown). In a third aspect, the grooves 210 may form a cross-hatch or a mesh of polygonal shapes (neither shown). The grooves 210 may have a pitch of approximately 30-100 microns ($\mu$m), although other pitches may be possible. A die is placed on the substrate 200 within the field 212 delimited by the trench 202 and coextensive with the grooves 210. Further, while a uniform pitch is contemplated, the present disclosure is not so limited. The width of a groove 210 may be approximately 0.5-1.5 millimeters (mm), although again, other widths are possible. The depth of a groove 210 may be approximately 0.5-1.5 mm. In a first aspect, the grooves 210 may be rectilinear with right-angled interior angles. However, such a perfect shape may be difficult to achieve using mechanical scoring tools, and, as better illustrated in FIG. 3, the grooves 210 may have sloped sides. As used herein approximately means within five percent (5%).

Figure 3:
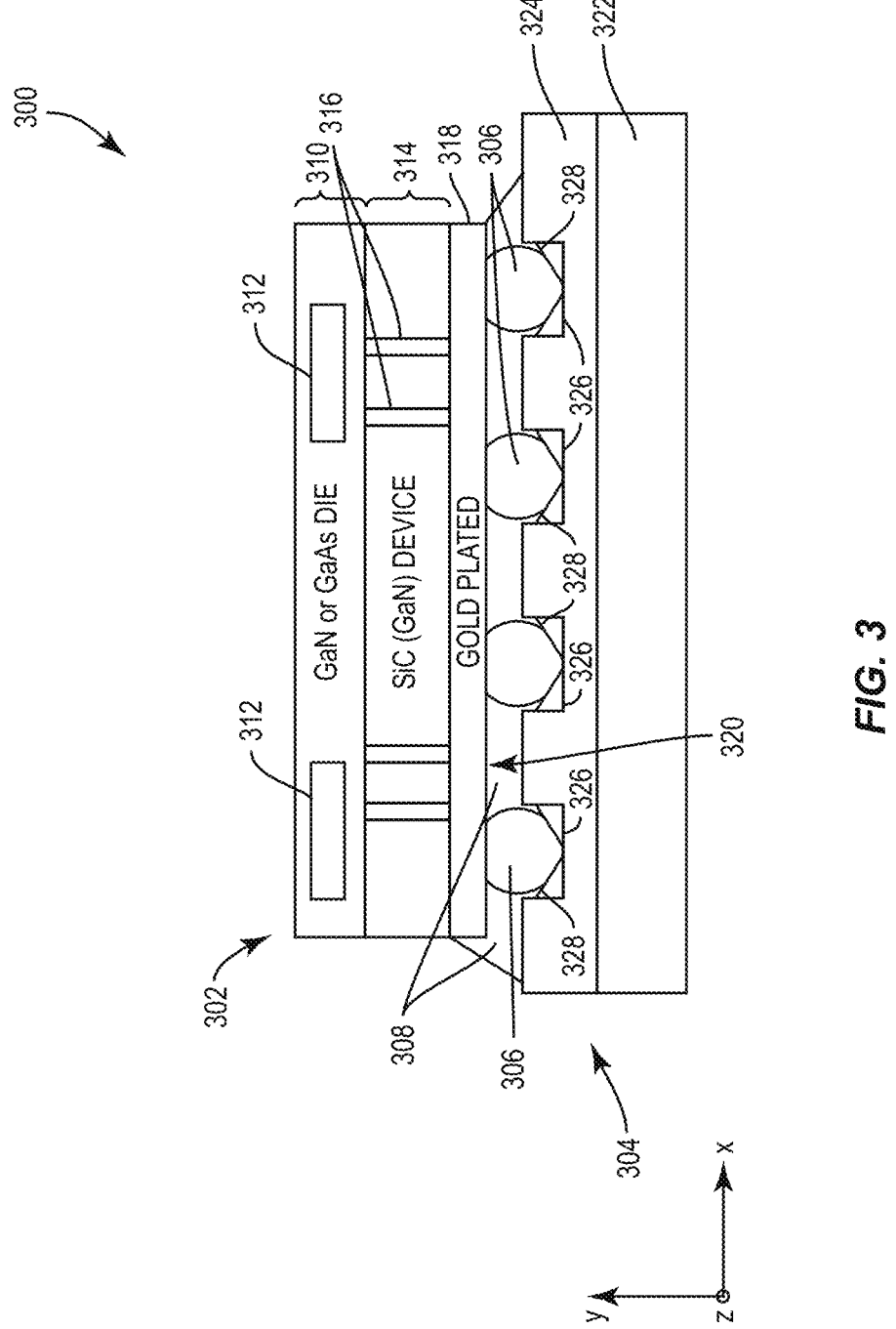
FIG. 3 is a side elevation view of a die attached to a substrate according to exemplary aspects of the present disclosure.

FIG. 3 illustrates an assembly 300 having a die 302 mounted on a substrate 304 using die or stud bumps 306 as well as an optional die-attach material 308. The die 302 may include a first layer 310 having transistors 312 therein. The first layer 310 may be a GaN or GaAs material, for example, although other materials are possible. The first layer 310 may be positioned on a second layer 314, which may include vias 316 and/or metallization layers (not shown). The second layer 314 may be a Si or GaN material, for example, although other materials are possible. The second layer 314 may be positioned on a third layer 318, which may be a thermally-conductive first material such as Au. The third layer 318 may have a bottom surface 320.

The stud bumps 306 may be attached to the bottom surface 320 and extend downwardly in the y-axis direction therefrom. In an exemplary aspect, the stud bumps 306 may have a vertical (y-axis) dimension of approximately 0.1 to 0.5 mm. Further, the stud bumps 306 may be made from the same first material as the third layer 318. The die-attach material 308 may be a low-temperature die-attach material that flows readily in relatively low temperatures (e.g., high enough to melt the die-attach material, but below approximately 350° C. so as not to damage the transistors 312). Further, the die-attach material 308 may be the same first material as the third layer 318.

The substrate 304 may include a bottom layer 322, which may be, for example, Cu, Ni, or Cu/Ni alloy. The substrate 304 may further include a top layer 324, which may be the same first material as the third layer 318. The top layer 324 may be scored or etched to form grooves 326 similar to the grooves 210 of FIG. 2. While the grooves 210 were described as being rectilinear, the etching or scoring process may not create perfect right angles, and the grooves 326 may include sloped walls 328 formed by the etching or scoring process. Collectively, the top layer 324, the stud bumps 306, the die-attach material 308, and the third layer 318 form bonding means.

During fabrication, the stud bumps 306 are formed at a desired height on the third layer 318. The grooves 326 are formed in the top layer 324. The die-attach material 308 is applied on a top surface of the top layer 324, partially filling the grooves 326. The die 302 is then pressed down onto the substrate 304, causing the stud bumps 306 to enter the grooves 326. Heat is applied to cause the die-attach material

308 to melt and flow and bond with the stud bumps 306, the third layer 318, and the top layer 324. Further, insertion of the stud bumps 306 expands the amount of surface area on which bonding may occur, which in turn increases the interlocking function of the bonding means.

While gold, and particularly fused gold, is specifically contemplated as the first material for the bonding means 318, 306, 308, and 324, other materials such as platinum (Pt), fused platinum, silver (Ag), fused silver, copper (Cu), fused copper, or the like may be used. Likewise, the first material may be sintered or fused to improve the pureness of the material to make the different bonding points more homogeneous. As used herein, substantially homogeneous means having a purity of ninety-eight percent (98%) or more.

Using the teachings of the present disclosure, it is possible to have an x-axis to z-axis aspect ratio of transistors 312 ranging from 1:1 to 10:1 without generating enough sheer from thermal cycling to generate breakage of the bond. That is, relatively long runs of transistors 312 in the x-axis are possible. Previous techniques were unable to exceed an aspect ratio of 3:1.

Figure 4:
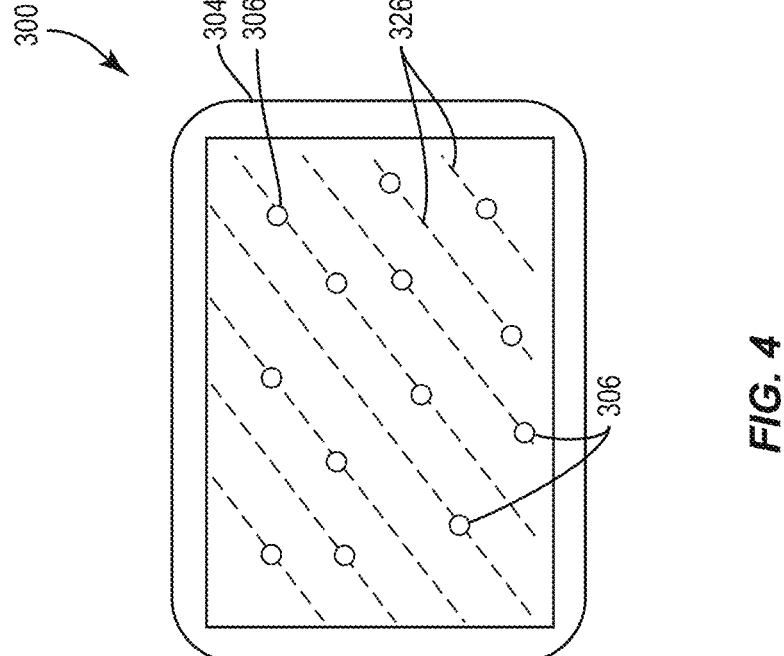
FIG. 4 is a top plan view of the die attached to the substrate with stud bumps visible through the die and positioned in the trenches of the substrate.

FIG. 4 provides a top plan view of the assembly 300 of FIG. 3. Stud bumps 306 are shown aligning with the grooves 326.

Figure 5:
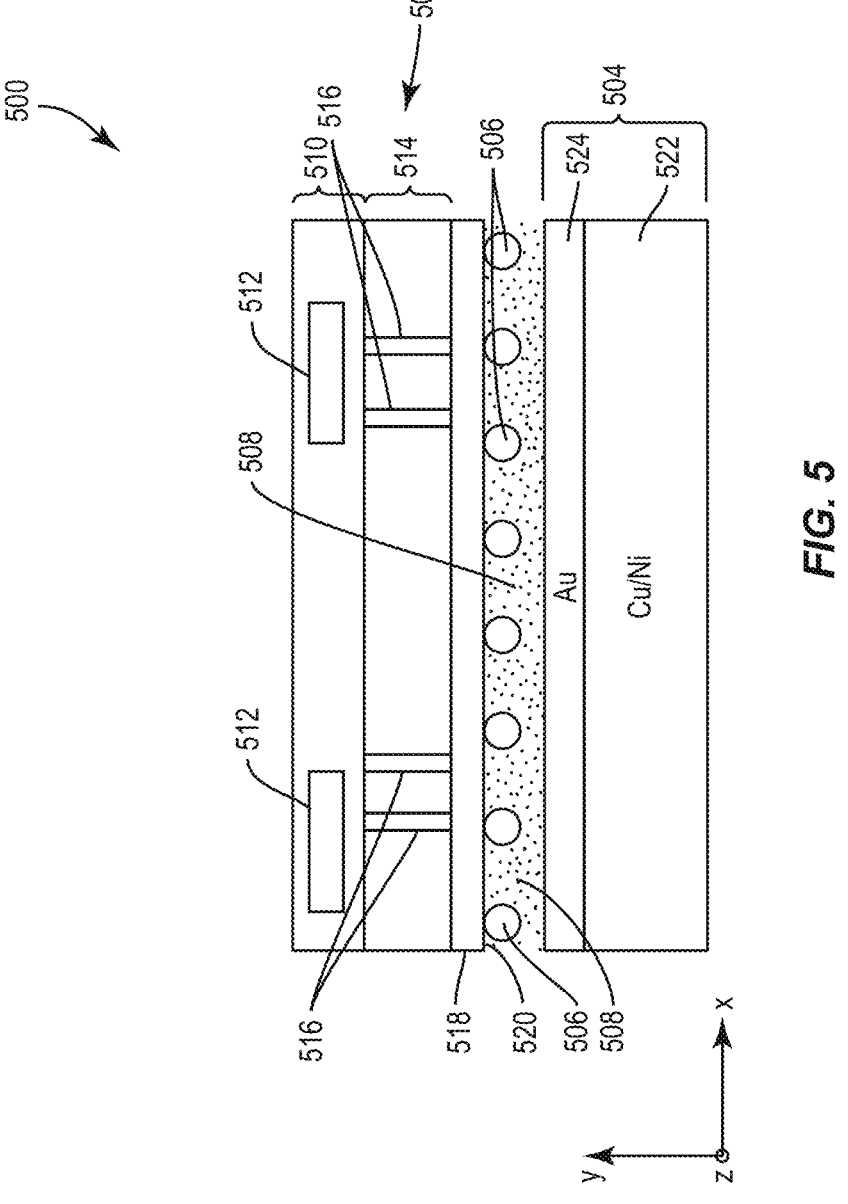
FIG. 5 is a side elevation view of a die attached to a substrate according to an exemplary aspect of the present disclosure.

While exemplary aspects of the present disclosure contemplate using both the grooves and the homogeneous materials to increase the bonding between the die and the substrate so as to avoid maximally stress-causing cracks in the bond, the present disclosure is not so limited. In a first aspect, grooves with stud bumps may be used with heterogeneous bonding means. In a second aspect, illustrated by assembly 500 in FIG. 5, the bonding means remains homogeneous, but the grooves are omitted.

In this regard, the assembly 500 includes a die 502 mounted on a substrate 504 using die or stud bumps 506 as well as an optional die-attach material 508. The die 502 may include a first layer 510 having transistors 512 therein. The first layer 510 may be positioned on a second layer 514, which may include vias 516 and/or metallization layers (not shown). The second layer 514 may be a Si or GaN material, for example, although other materials are possible. The second layer 514 may be positioned on a third layer 518, which may be a thermally-conductive first material such as Au. The third layer 518 may have a bottom surface 520.

The stud bumps 506 may be attached to the bottom surface 520 and extend downwardly in the y-axis direction therefrom. The stud bumps 506 may be made from the same first material as the third layer 518. The die-attach material 508 may be a low-temperature die-attach material that flows readily in relatively low temperatures (e.g., high enough to melt the die-attach material, but below approximately 350° C. so as not to damage the transistors 512). Further, the die-attach material 508 may be the same first material as the third layer 518.

The substrate 504 may include a bottom layer 522, which may be, for example, Cu, Ni, or Cu/Ni alloy. The substrate 504 may further include a top layer 524, which may be the same first material as the third layer 518.

As with the assembly 300 of FIG. 3, the assembly 500 is heated, causing the bonding means to melt and bond. The homogeneity of the material allows this bonding to be more readily accomplished and helps maintain cohesion during repeated thermal cycling.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. An assembly comprising:
  a die comprising:
    one or more transistors therein; and
    a bottom surface;
  a substrate comprising;
    a bottom layer; and
    a top layer positioned on the bottom layer, the top layer comprising a top surface, the top surface comprising a plurality of grooves thereon, wherein each of the grooves comprises a continuous line with a rectilinear cross-section, wherein each of the plurality of the grooves further comprises a groove bottom surface; and
  a plurality of stud bumps extending from the bottom surface to at least one groove bottom surface of the plurality of grooves.

2. The assembly of claim 1, further comprising a die-attach material surrounding the plurality of stud bumps and extending between the top surface and the bottom surface.

3. The assembly of claim 1, wherein the top surface further comprises a trench spaced inwardly from a perimeter of the substrate and extending around the perimeter of the substrate.

4. The assembly of claim 1, wherein each groove of the plurality of grooves has a depth of approximately 0.5 to 1.5 millimeters (mm).

5. The assembly of claim 1, wherein the plurality of grooves are arranged in a series of parallel lines.

6. The assembly of claim 5, wherein the series of parallel lines have a pitch of approximately 30-100 microns (pm).

7. The assembly of claim 1, wherein each groove of the plurality of grooves has a width of approximately 0.5 to 1.5 millimeters (mm).

8. The assembly of claim 1, wherein the plurality of stud bumps have a vertical dimension of approximately 0.1 to 0.5 millimeters (mm).

9. The assembly of claim 1, wherein the top surface, the bottom surface, and the plurality of stud bumps all comprise a first substantially homogeneous material.

10. The assembly of claim 9, wherein the first substantially homogeneous material comprises gold (Au) or a gold alloy.

11. The assembly of claim 10, further comprising a die-attach material comprising the first substantially homogeneous material.

* * * * *